(12) United States Patent
Daijo

(10) Patent No.: US 7,046,047 B2
(45) Date of Patent: May 16, 2006

(54) CLOCK SWITCHING CIRCUIT

(75) Inventor: Jiro Daijo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 6 days.

(21) Appl. No.: 10/875,220

(22) Filed: Jun. 25, 2004

(65) Prior Publication Data

US 2005/0140398 A1    Jun. 30, 2005

(30) Foreign Application Priority Data

Dec. 25, 2003   (JP) ............................. 2003-430108

(51) Int. Cl.
*G06F 1/08* (2006.01)

(52) U.S. Cl. .................... 327/99; 327/298; 327/407

(58) Field of Classification Search ................. 327/407, 327/298, 99
See application file for complete search history.

(56) References Cited

U.S. PATENT DOCUMENTS

| | | | | |
|---|---|---|---|---|
| 4,970,405 A * | 11/1990 | Hagiwara | ................... | 327/145 |
| 5,126,594 A * | 6/1992 | Shaik et al. | ................... | 327/78 |
| 5,128,554 A * | 7/1992 | Hoshizaki | ................... | 327/147 |
| 5,726,593 A * | 3/1998 | Ruuskanen | ................... | 327/99 |
| 5,811,995 A * | 9/1998 | Roy et al. | ...................... | 327/99 |
| 6,040,725 A * | 3/2000 | Lee et al. | ..................... | 327/175 |
| 6,292,044 B1* | 9/2001 | Mo et al. | ..................... | 327/298 |
| 6,411,134 B1* | 6/2002 | Manz et al. | ................. | 327/298 |
| 6,535,048 B1* | 3/2003 | Klindworth | ................. | 327/407 |
| 6,563,349 B1* | 5/2003 | Menezes et al. | ............ | 327/407 |
| 6,600,345 B1* | 7/2003 | Boutaud | ...................... | 327/99 |
| 6,784,699 B1* | 8/2004 | Haroun et al. | ................ | 327/99 |

FOREIGN PATENT DOCUMENTS

| | | |
|---|---|---|
| JP | 06-209309 | 7/1994 |
| JP | 2001-209453 | 8/2001 |

* cited by examiner

*Primary Examiner*—Kenneth B. Wells
*Assistant Examiner*—Khareem E. Almo
(74) *Attorney, Agent, or Firm*—Arent Fox PLLC (57) ABSTRACT

A clock switching circuit capable of preventing occurrence of hazards in an output clock signal at a time of clock switching, regardless of the frequency ratio of input clock signals. At a time of switching to a second input clock signal CLKIN_B from a first input clock signal CLKIN_A, the output of the first input clock signal is disabled based on an output signal of a first flip-flop group which takes in an inverted signal nSEL of a select signal SEL according to the first input clock signal CLKIN_A. In addition, the output of the second input clock signal CLKIN_B is resumed based on an output signal of a fourth flip-flop group which takes in an output signal from the first flip-flop group according to the second input clock signal CLKIN_B.

6 Claims, 6 Drawing Sheets

CLOCK SWITCHING CIRCUIT

CROSS-REFERENCE TO RELATED APPLICATIONS

This application is based upon and claims the benefits of priority from the prior Japanese Patent Application No. 2003-430108, filed on Dec. 25, 2003, the entire contents of which are incorporated herein by reference.

BACKGROUND OF THE INVENTION (1) Field of the Invention

This invention relates to a clock switching circuit for switching and outputting a plurality of input clock signals having different frequencies and, in particular, to a clock switching circuit usable regardless of the frequency ratio of input clock signals.

(2) Description of the Related Art

Recently large-scale integration (LSI) systems are designed to dynamically change an operating clock frequency because of a strong demand of low current consumption. To meet this demand, they operate with a lower-frequency clock signal during slow operation such as standby, for example. Each of the LSI systems containing phase-locked loops (PLL) requires to dynamically switch between an output clock signal of the PLL and a different clock signal. As clock signals to be switched, asynchronous clock signals having different frequencies and different periods are used in many cases.

To select one clock signal out of two, conventional LSI systems use simple selectors. These simple selectors, however, have a problem that asynchronous input clock signals produce an output clock signal having an irregular pulse width called a hazard, thereby causing circuit malfunction.

To solve this problem, such asynchronous-clock switching circuit as to prevent hazards has been proposed.

Figure 4:
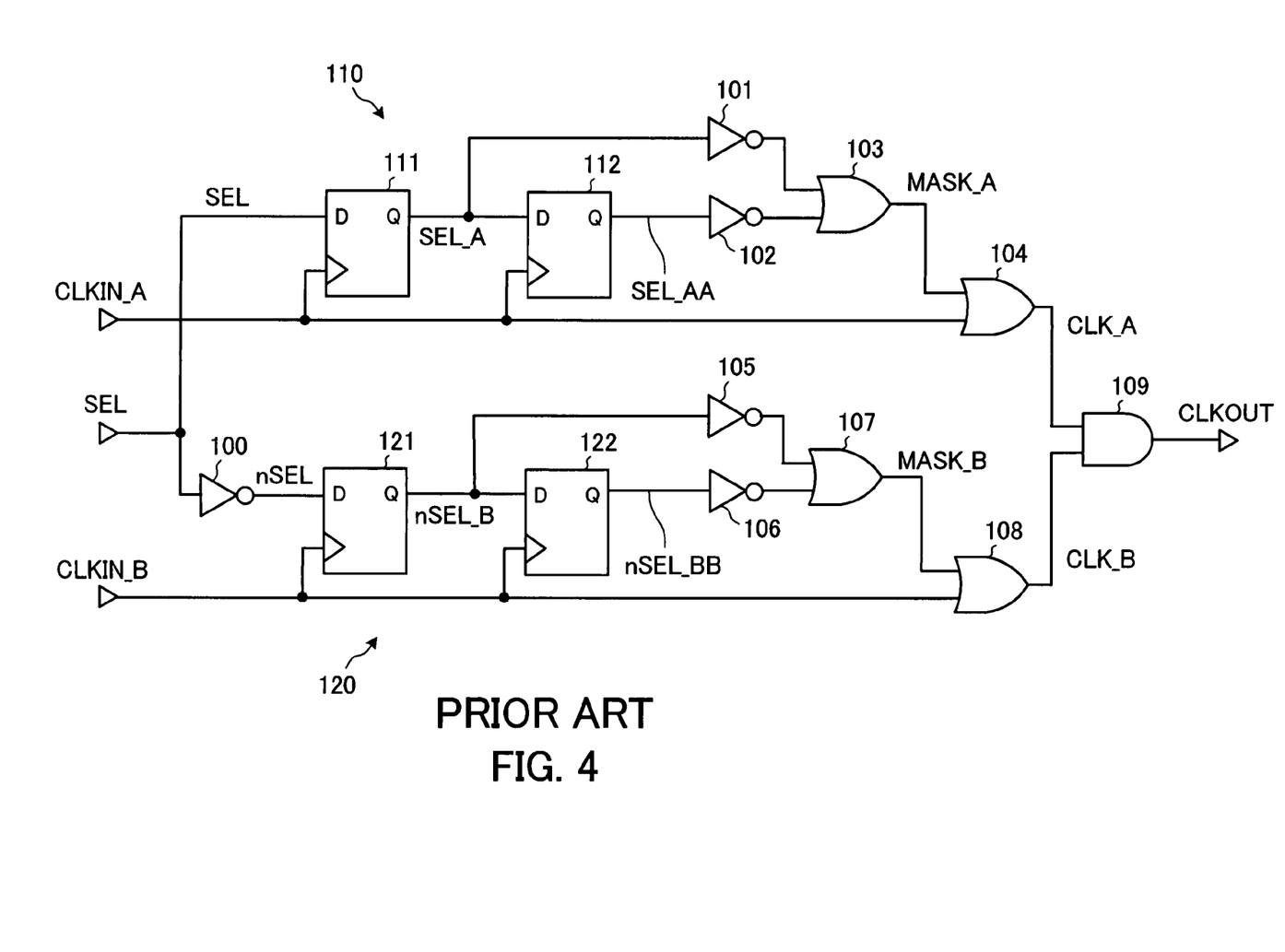
FIG. 4 shows an example of a construction of a conventional clock switching circuit.

FIG. 4 shows an example of a construction of a conventional clock switching circuit.

This clock switching circuit of FIG. 4 switches between two asynchronous input clock signals CLKIN_A and CLKIN_B based on a select signal SEL and outputs one signal as an output clock signal CLKOUT. An H-level select signal SEL selects the input clock signal CLKIN_A while an L-level select signal SEL selects the input clock signal CLKIN_B.

This clock switching circuit is composed of a first flip-flop (FF) group 110, a second FF group 120, and an AND gate 109. The first FF group 110 is provided with two-stage FFs 111 and 112 which both operate according to one input clock signal CLKIN_A, and disables the output of this signal CLKIN_A while the signal is not selected. Similarly, the second FF group 120 is provided with two-stage FFs 121 and 122 which both operate according to the other input clock signal CLKIN_B, and disables the output of this signal CLKIN_B in case where the signal is not selected. The AND gate 109 receives output signals CLK_A and CLK_B from the first and second FF groups 110 and 120 and outputs the output clock signal CLKOUT.

The first FF group 110 is composed of the two-stage FFs 111 and 112, inverters 101 and 102, and OR gates 103 and 104. The FF 111 takes in the select signal SEL on the rising edge of the input clock signal CLKIN_A. The FF 112 takes in an output signal SEL_A of the FF 111 on the rising edge of the input clock signal CLKIN_A.

The inverter 101 inverts and enters the output signal SEL_A of the FF 111 to one input terminal of the OR gate 103. The inverter 102 inverts and enters an output signal SEL_AA of the FF 112 to the other input terminal of the OR gate 103. An output signal (clock mask signal MASK_A) of the OR gate 103 and the input clock signal CLKIN_A are entered to the input terminals of the OR gate 104. An output signal CLK_A of the OR gate 104 is entered to one input terminal of the AND gate 109.

Similarly, the second FF group 120 is composed of the two-stage FFs 121 and 122, inverters 105 and 106, OR gates 107 and 108. The FF 121 takes in the inverted signal nSEL of the select signal SEL on the rising edge of the input clock signal CLKIN_B. The FF 122 takes in an output signal nSEL_B of the FF 121 on the rising edge of the input clock signal CLKIN_B.

The inverter 105 inverts and enters the output signal nSEL_B of the FF 121 to one input terminal of the OR gate 107. The inverter 106 inverts and enters an output signal nSEL_BB of the FF 122 to the other input terminal of the OR gate 107. In the input terminals of the OR gate 108, an output signal (clock mask signal MASK_B) of the OR gate 107 and the input clock signal CLKIN_B are entered. An output signal CLK_B of the OR gate 108 is entered to the other input terminal of the AND gate 109.

Figure 5:
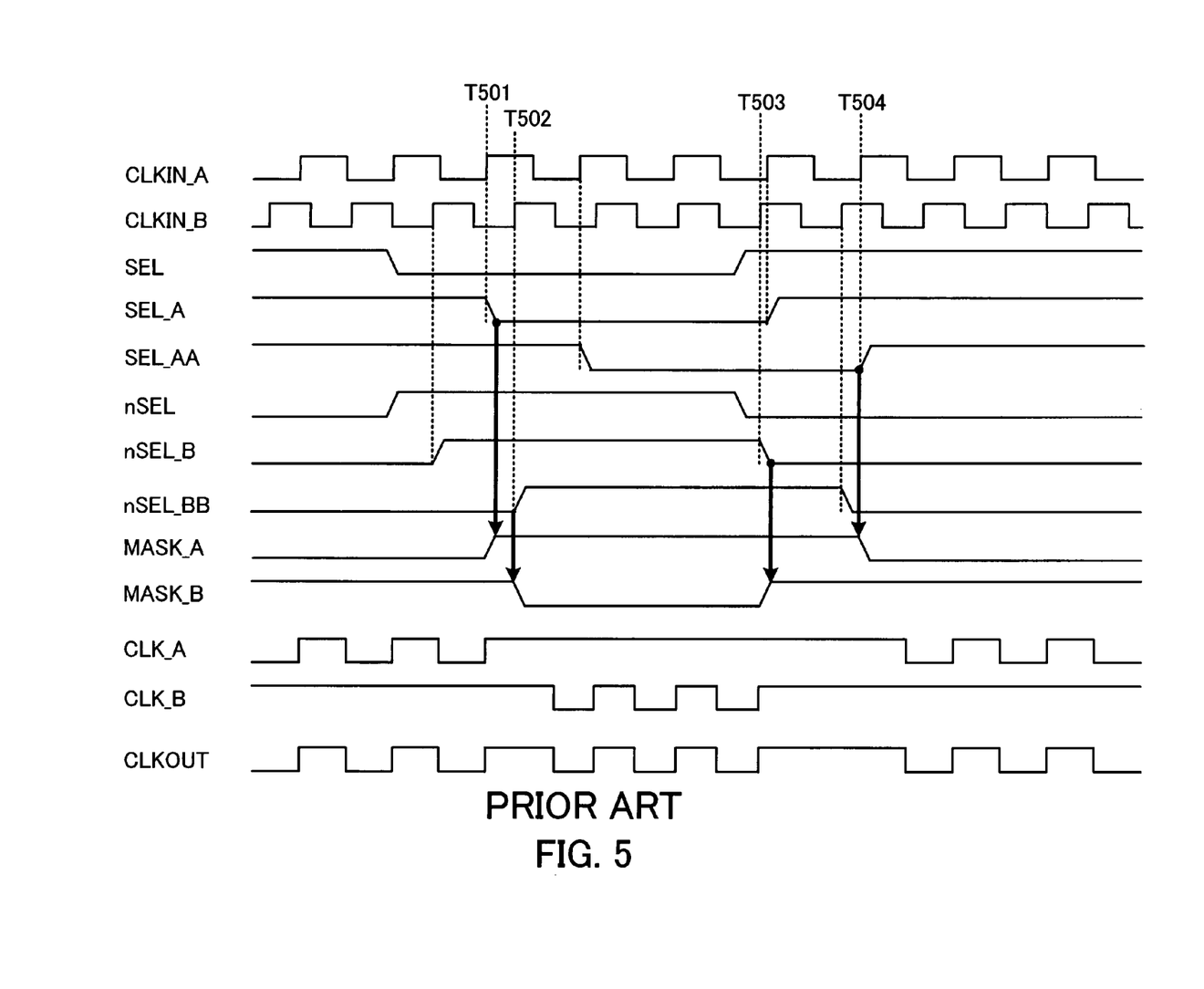
FIGS. 5 and 6 are first and second time charts showing signal output timing of each unit in the conventional clock switching circuit.

FIG. 5 shows a first time chart showing signal output timing of each unit in the above clock switching circuit.

In the first FF group 110, the input clock signal CLKIN_A is fixed at H level and masked in the OR gate 104 depending on the clock mask signal MASK_A output from the OR gate 103. The clock mask signal MASK_A starts to rise at the first rising time (T501) of the input clock signal CLKIN_A after the select signal SEL becomes L level. The clock mask signal MASK_A starts to fall at the second rising time (T504) of the input clock signal CLKIN_A after the select signal SEL becomes H level.

Similarly, in the second FF group 120, the input clock signal CLKIN_B is fixed at H level and masked in the OR gate 108 depending on the clock mask signal MASK_B output from the OR gate 107. The clock mask signal MASK_B starts to rise at the first rising time (T503) of the input clock signal CLKIN_B after the select signal SEL becomes H level. The clock signal MASK_B starts to fall at the second rising time (T502) of the input clock signal CLKIN_B after the select signal SEL becomes L level.

As described above, in each FF group, two-stage FFs which both operate according to the same input clock signal are connected in series, and masking starts based on an output signal of the first FF and the masking ends based on an output signal of the second FF. Accordingly, at the time of switching between input clock signals, there exist periods during which the clock mask signals MASK_A and MASK_B have both H level, like periods between the times T501 and T502 and the times T503 and T504 in FIG. 5. Therefore, the two input clock signals are avoided from being conflicted and output, thus preventing hazards.

In the circuit configuration of FIG. 4, the input clock signals are fixed at H level and masked. As an alternative way, the input clock signals can be fixed at L level and masked, provided that AND gates are arranged in place of gate circuits in each FF group and an OR gate is arranged in place of a gate circuit of the output stage.

The above clock switching circuit, however, has a problem that occurrence of hazards cannot be prevented if input clock signals have big difference in frequency, specifically, if one frequency is twice or more as fast as the other one.

Figure 6:
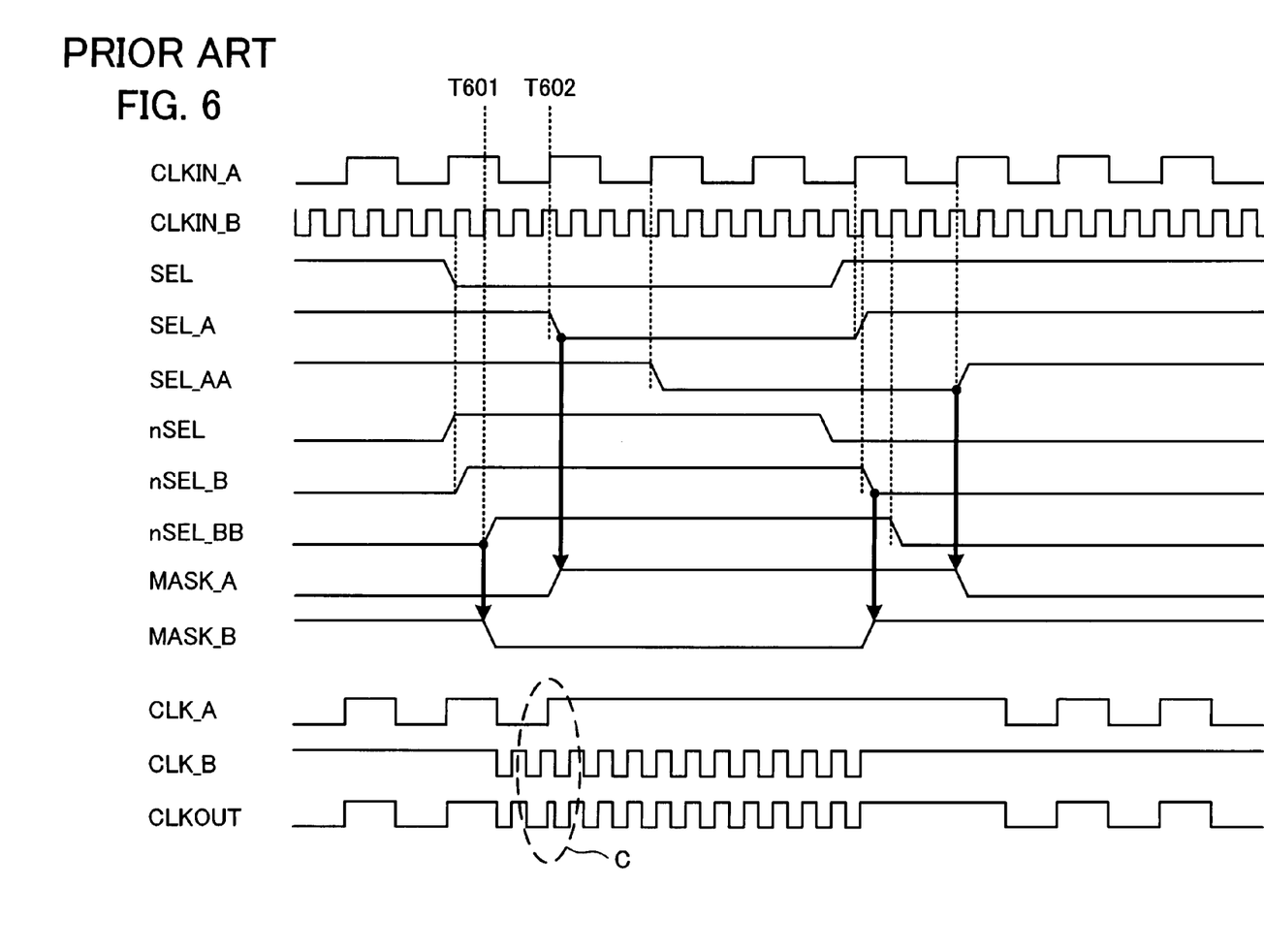

FIG. 6 is a second time chart showing signal output timing of each unit of the above clock switching circuit.

FIG. 6 shows an example of signal output timing in a case where the frequency of one input clock signal CLKIN_B is twice or more as fast as that of the other input clock signal CLKIN_A in the above clock switching circuit. In this FIG. 6, when the slow input clock signal CLKIN_A is switched to the fast input clock signal CLKIN_B based on a select signal SEL, a clock mask signal MASK_B changes to L level at time T601 before time T602 at which the clock mask signal MASK_A becomes H level. Therefore, during the times T601 to T602, the clock mask signals MASK_A and MASK_B have both L level, resulting in producing a hazard as shown in a part C in this figure.

This problem can be avoided by arranging more FFs in the FF group 110 for disabling the output of the slow input clock signal CLKIN_A, for example. With similar configuration, considering a communication interface with a hot plug function, a clock switching circuit has been proposed, which prevents occurrence of hazards at a time of switching between a fast input clock signal and a slow input clock signal output from a built-in PLL (for example, refer to Japanese Unexamined Patent Publication No. 2001-209453 (sections [0026] to [0040], FIG. 5)).

As a conventional related technical art, an asynchronous-clock switching circuit has been proposed. This circuit is provided with: a select signal generating part for controlling a selector based on a select signal, the selector selecting and sending clock signals of systems 0 and 1; and an inhibition area setting part for controlling a reset signal corresponding to each system. The circuit is designed such that the inhibition area setting part sets a hazard inhibition area according to a detection signal of a clock break of each system and performs the clock switching (for example, refer to Japanese Unexamined Patent Publication No. 6-209309 (sections [0019] to [0027], FIG. 2)).

SUMMARY OF THE INVENTION

This invention provides a clock switching circuit for switching and outputting a plurality of input clock signals having different frequencies. This clock switching circuit comprises: a first flip-flop group including at least one flip-flop operating according to a first input clock signal, for taking in the inverted signal of a select signal selecting a first or second input clock signal; a second flip-flop group including at least one flip-flop operating according to a second input clock signal, for taking in the select signal; a third flip-flop group including at least one flip-flop operating according to the first input clock signal, for taking in an output signal of the second flip-flop group; a fourth flip-flop group including at least one flip-flop operating according to the second input clock signal, for taking in an output signal of the first flip-flop group; and an output circuit for disabling output of one signal which is not selected by the select signal, out of the first and second input clock signals. The output circuit disables and resumes the output of the first input clock signal based on the output signals of the first and third flip-flop groups depending on whether the first input clock signal is selected, and disables and resumes the output of the second input clock signal based on the output signals of the second and fourth flip-flop groups depending on whether the second input clock signal is selected.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

As described in Description of the Related Art, conventional clock switching circuits as shown in FIG. 4 have a hazard problem in a case where the frequency of one input clock signal is twice or more as fast as that of the other one. To solve this problem, more flip-flops (FF) should be arranged in a FF group for disabling output of a slow input clock signal, like the clock switching circuit disclosed in Japanese Unexamined Patent Publication No. 2001-209453. This method, however, arises other problems in that a circuit scale becomes larger due to the increased number of FFs and a single circuit cannot handle all frequency ratios because a treatable frequency ratio of input clock signals is determined based on the number of FFs provided in a FF group, resulting in low versatility.

In view of foregoing, the present invention has been made to propose a clock switching circuit capable of preventing occurrence of hazards in an output clock signal at a time of clock switching, regardless of the frequency ratio of input clock signals.

Preferred embodiment of the present invention will be described in detail with reference to the accompanying drawings.

Figure 1:
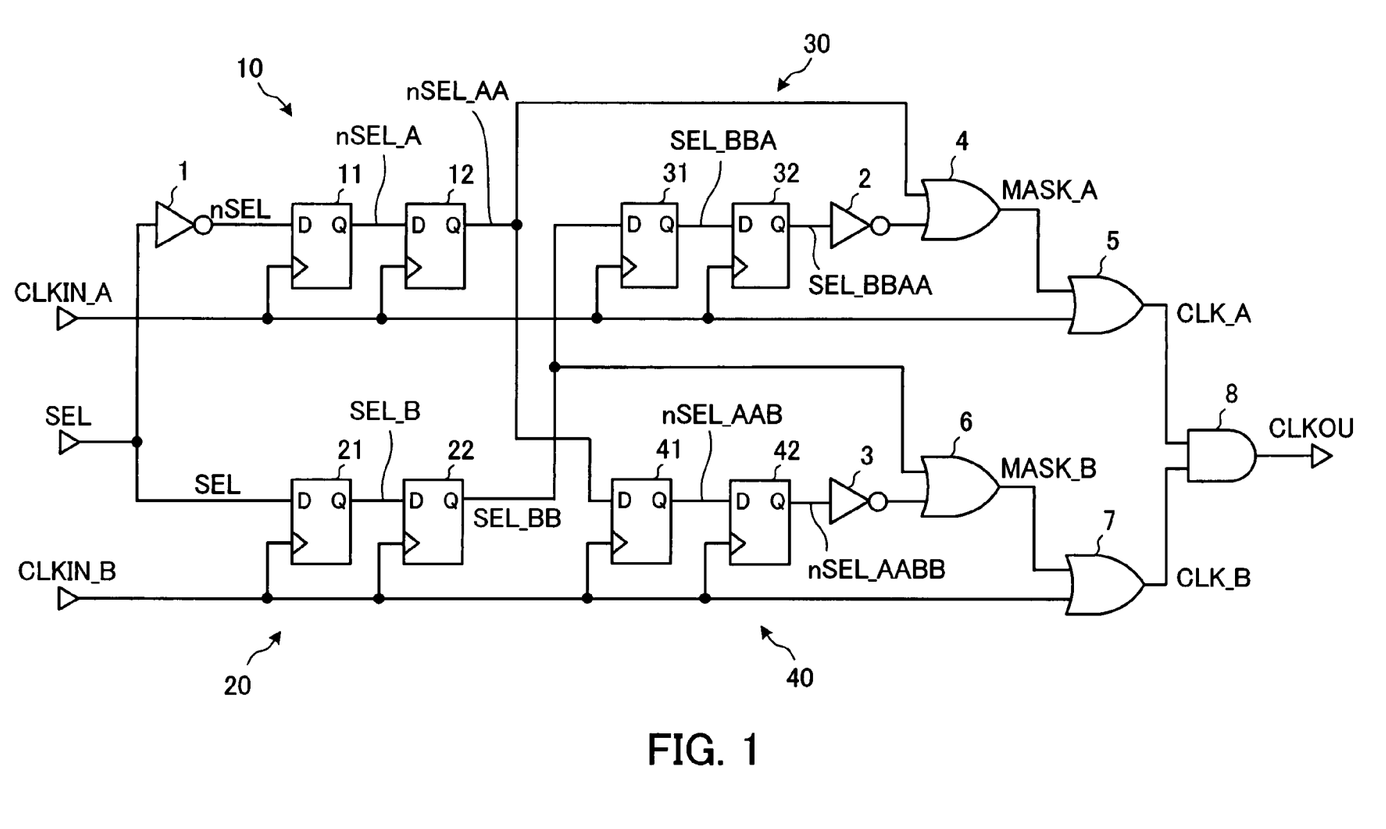
FIG. 1 is an example of a construction of a clock switching circuit according to one embodiment of the present invention.

FIG. 1 shows an example of a construction of a clock switching circuit according to the embodiment of the present invention.

This clock switching circuit of FIG. 1 switches between two input clock signals CLKIN_A and CLKIN_B having different frequencies based on a select signal SEL and outputs an output clock signal CLKOUT. An H-level select signal SEL selects the input clock signal CLKIN_A while an L-level select signal SEL selects the input clock signal CLIKIN_B.

This clock switching circuit is composed of first to fourth FF groups 10, 20, 30, and 40, and an output circuit. The first FF group 10 is provided with two-stage FFs 11 and 12 which both operate according to the input clock signal CLKIN_A, and receives an inverted signal nSEL obtained by inverting the select signal SEL by an inverter 1. The second FF group 20 is provided with two-stage FFs 21 and 22 which both operate according to the input clock signal CLKIN_B, and receives the select signal SEL. The third FF group 30 is provided with two-stage FFs 31 and 32 which both operate according to the input clock signal CLKIN_A, and receives an output signal SEL_BB of the second FF group 20. The fourth FF group 40 is provided with two-stage FFs 41 and 42 which both operate according to the input clock signal CLKIN_B, and receives an output signal nSEL_AA of the first FF group 10. The output circuit is composed of inverters 2 and 3, OR gates 4 to 7, and AND gate 8, and outputs the output clock signal CLKOUT based on output signals of the first to fourth FF groups 10, 20, 30 and 40.

In the first FF group 10, the FF 11 takes in the inverted signal nSEL of the select signal SEL on the rising edge of the input clock signal CLKIN_A. The FF 12 takes in an output signal nSEL_A of the FF 11 on the rising edge of the input clock signal CLKIN_A.

In the second FF group 20, the FF 21 takes in the select signal SEL on the rising edge of the input clock signal CLKIN_B. The FF 22 takes in an output signal SEL_B of the FF 21 on the rising edge of the input clock signal CLKIN_B.

In the third FF group 30, the FF 31 takes in an output signal SEL_BB of the FF 22 of the second FF group 20 on the rising edge of the input clock signal CLKIN_A. The FF 32 takes in an output signal SEL_BBA of the FF 31 on the rising edge of the input clock signal CLKIN_A.

The inverter 2 inverts an output signal SEL_BBAA of the FF 32. The OR gate 4 receives an output signal nSEL_AA of the FF 12 of the first FF group 10 and an output signal of the inverter 2 and outputs a clock mask signal MASK_A which masks the input clock signal CLKIN_A in case where this signal is not selected. The OR gate 5 receives the clock mask signal MASK_A from the OR gate 4 and the input clock signal CLKIN_A and enters an output signal CLK_A to one input terminal of the AND gate 8.

In the fourth FF group 40, the FF 41 takes in an output signal nSEL_AA of the FF 12 of the first FF group 10 on the rising edge of the input clock signal CLKIN_B. The FF 42 takes in an output signal nSEL_AAB of the FF 41 on the rising edge of the input clock signal CLKIN_B.

The inverter 3 inverts an output signal nSEL_AABB of the FF 42. The OR gate 6 receives an output signal SEL_BB of the FF 22 of the second FF group 20 and an output signal from the inverter 3 and outputs a clock mask signal MASK_B which masks the input clock signal CLKIN_B in case where this signal is not selected. The OR gate 7 receives the clock mask signal MASK_B from the OR gate 6 and the input clock signal CLKIN_B, and enters an output signal CLK_B to the other input terminal of the AND gate 8.

In this clock switching circuit, the OR gate 4 creates the clock mask signal MASK_A for masking the input clock signal CLKIN_A, from the output signal nSEL_AA entered from the first FF group 10 and the inverted signal nSEL_BBAA of the output signal SEL_BBAA entered from the third FF group 30. The first and third FF groups 10 and 30 both operate according to the input clock signal CLKIN_A, and the third FF group 30 receives the output signal SEL_BB from the second FF group 20 which operates according to the input clock signal CLKIN_B. Therefore, the inverted signal nSEL_BBAA entered into the OR gate 4 from the inverter 2 is a signal synchronized with both the input clock signals CLKIN_A and CLKIN_B.

Similarly, the OR gate 6 creates the clock mask signal MASK_B for masking the input clock signal CLKIN_B from the output signal SEL_BB entered from the second FF group 20 and the inverted signal SEL_AABB of the output signal nSEL_AABB entered from the fourth FF group 40. The second and fourth FF groups 20 and 40 both operate according to the input clock signal CLKIN_B and the fourth FF group 40 receives the output signal nSEL_AA from the first FF group 10 which operates according to the input clock signal CLKIN_A. Therefore, the inverted signal SEL_AABB entered from the inverter 3 to the OR gate 6 is a signal synchronized with both the input clock signals CLKIN_A and CLKIN_B.

The present invention has such characteristics that signals obtained by synchronizing the select signal SEL (or inverted signal nSEL) with both the input clock signals CLKIN_A and CLKIN_B are used to produce the clock mask signals MASK_A and MASK_B. These signals are used for starting and stopping masking the input clock signals CLKIN_A and CLKIN_B.

Now, operation of the clock switching circuit of FIG. 1 of a time when asynchronous clock signals are entered will be described with reference to time charts. In these time charts, the frequency of the input clock signal CLKIN_B is twice or more as fast as that of the input clock signal CLKIN_A.

Figure 2:
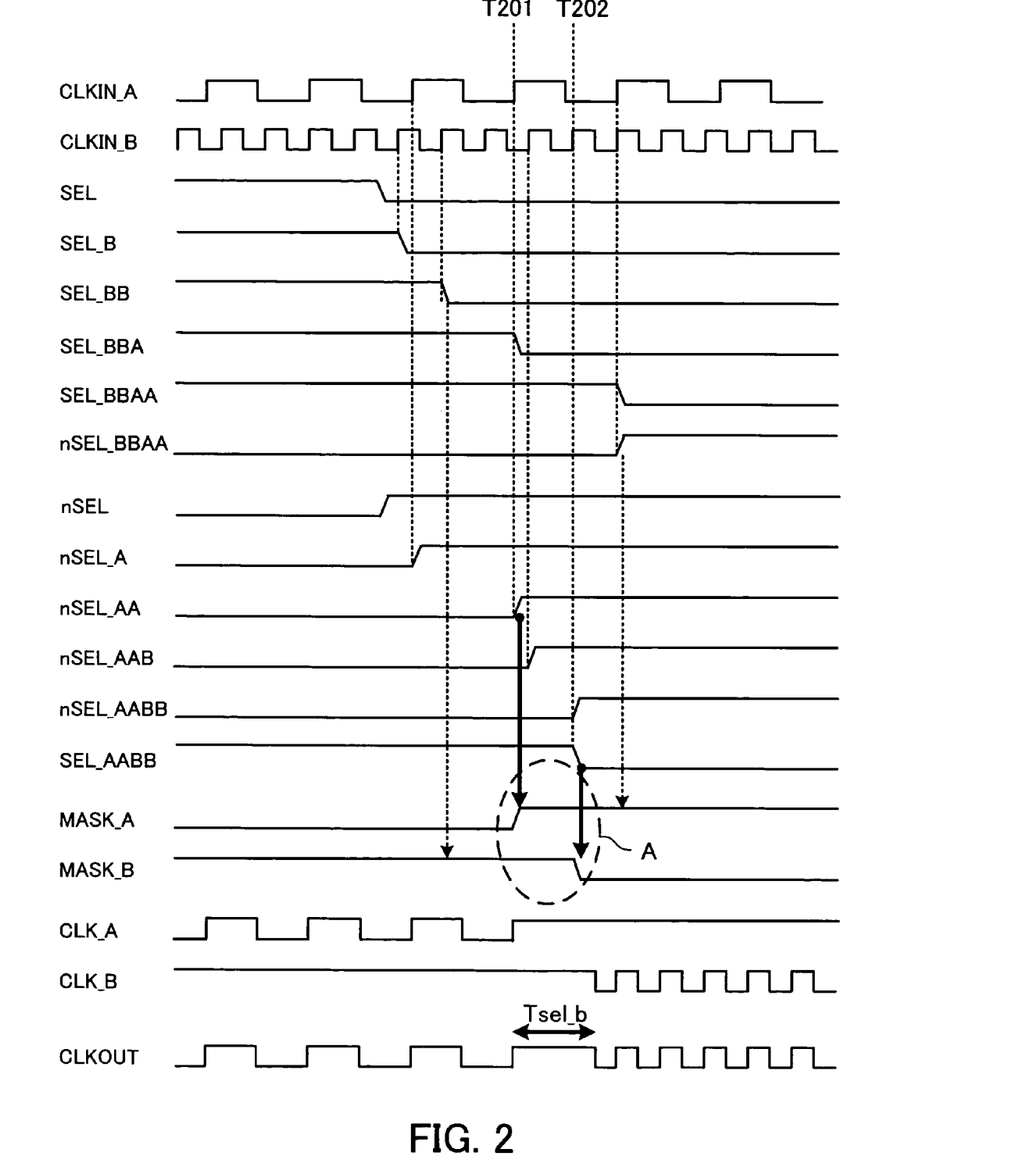
FIG. 2 is a time chart showing signal output timing of each unit of a time of switching to an input clock signal of higher frequency in the clock switching circuit according to the embodiment of the present invention.

FIG. 2 is a time chart showing signal output timing of each unit of a time when the clock switching circuit switches to the input clock signal CLKIN_B of higher frequency.

When the select signal SEL becomes L level to switch to the input clock signal CLKIN_B, the clock mask signal MASK_A changes to H level at a time T201 when the output signal nSEL_AA of the first FF group 10 becomes H level. Since the input clock signal CLKIN_A is fixed at H level and masked, this signal is not output. On the other hand, the clock mask signal MASK_B changes to L level at a time T202 when the inverted signal SEL_AABB of the output signal nSEL_AABB of the fourth FF group 40 becomes L level. Thereby masking of the input clock signal CLKIN_B is cancelled and its output is resumed.

The output of the input clock signal CLKIN_A starts to be disabled at a second rising time (T201) of the input clock signal CLKIN_A after the select signal SEL becomes L level. The output of the input clock signal CLKIN_B is resumed at a time T202 when a signal (nSEL_AABB) becomes H level, which is created by taking in signals at two rising edges of each of the input clock signals CLKIN_A and then CLKIN_B after the change of the select signal SEL.

Therefore, the time (T202) of resuming the output of the input clock signal CLKIN_B is definitely later than the time (T201) of disabling the output of the input clock signal CLKIN_A, regardless of the frequency ratio of the input clock signals CLKIN_A and CLKIN_B. Therefore, like a period shown in a part A of this figure, there exists a period during which the clock mask signals MASK_A and MASK_B definitely both have H level. And during this period, the output clock signal CLKOUT becomes a signal with a pulse width Tsel_b at least longer than the pulse width of the input clock signal CLKIN_B. In other words, it impossibly occurs that a signal with a pulse width shorter than that of the input clock signal CLKIN_B appears. Such a short pulse width in the output clock signal CLKOUT causes circuit malfunction with a higher possibility. A signal with a longer pulse width, on the contrary, does not cause a glitch in circuits.

Figure 3:
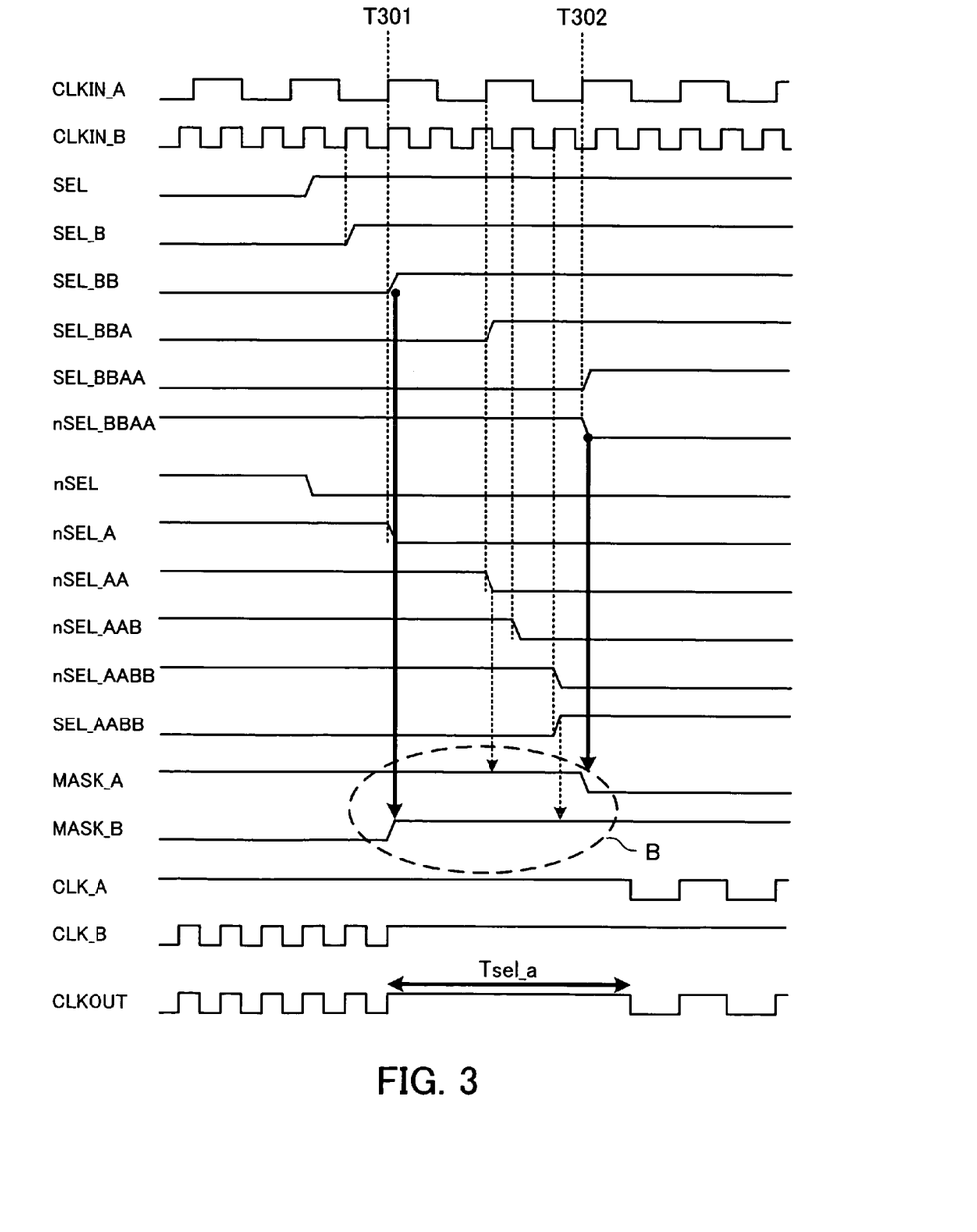
FIG. 3 is a time chart showing signal output timing of each unit of a time of switching to an input clock signal of lower frequency in the clock switching circuit according to the embodiment of the present invention.

FIG. 3 is a time chart showing signal output timing of each unit of a time when the above clock switching circuit switches to the input clock signal CLKIN_A of lower frequency.

In a case where the select signal SEL changes to H level to switch to the input clock signal CLKIN_A, the clock switching circuit operates similarly to the case of FIG. 2. That is, the clock mask signal MASK_B changes to H level at a time T301 when the output signal SEL_BB of the second FF group 20 becomes H level, resulting in disabling the output of the input clock signal CLKIN_B. Then the clock mask signal MASK_A changes to L level at a time T302 when the inverted signal nSEL_BBAA of the output signal SEL_BBAA of the third FF group 30 becomes L level, resulting in resuming the output of the input clock signal CLKIN_A.

The output of the input clock signal CLKIN_B starts to be disabled at the second rising time (T301) of the input clock signal CLKIN_B after the select signal SEL becomes H level. Then the output of the input clock signal CLKIN_A is resumed at the time T302 when a signal (SEL_BBAA) changes to H level, which is created by taking in signals at two rising edges of each of the input clock signals CLKIN_B and then CLKIN_A after the change of the select signal SEL.

Therefore, the time (T302) of resuming the output of the input clock signal CLKIN_A is definitely later than the start time (T301) of disabling the output of the input clock signal CLKIN_B, regardless of the frequency ratio of the input clock signals CLKIN_A and CLKIN_B. Therefore, at the time of switching to the input clock signal CLKIN_A, there exists a period during which the clock mask signals MASK_A and MASK_B definitely both have H level, as shown in a part B of this figure. During this period, the output clock signal CLKOUT is a signal with a pulse width Tsel_a at least longer than the pulse width of the input clock signal CLKIN_B.

As described above, at the time of switching between the input clock signals CLKIN_A and CLKIN_B, hazards and irregular pulses do not appear in the output clock signal CLKOUT even these signals are asynchronous to each other and one frequency is twice or more as fast as the other. Therefore, a versatile and stable clock switching circuit can be realized, which does not limit the frequencies of input clock signals.

Although two-stage FFs are provided in each FF group 10, 20, 30 and 40 in the above-described embodiment, a single FF can be provided. However, arranging two-stage FFs can surely prevent occurrence of hazards in an output signal of a FF in a case where a select signal SEL is entered in asynchronous with two input clock signals.

Further, although each FF operates on the rising edge of an input clock signal in the above-described embodiment, the FF can be designed to operate on the falling edge. In this case, AND gates and an OR gate may be provided in place of the OR gates and AND gate in the above circuit, respectively.

Furthermore, by providing a plurality of the above clock switching circuits, three or more input clock signals can be switched and output. For example, one clock switching circuit may switch between first and second input clock signals and the other clock switching circuit may switch between the output clock signal of the one switching circuit and a third clock signal.

According to the clock switching circuit of the present invention, first and second clock signals are both prevented from being output during a certain period of time at a time of clock switching, so that a signal with a pulse width shorter than the pulse width of the first or second input clock signal does not appear in the output clock signal. As a result, hazards can be prevented at a time of clock switching, regardless of the frequency ratio of input clock signals, resulting in realizing stable switching of asynchronous input clock signals.

The foregoing is considered as illustrative only of the principle of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A clock switching circuit for switching and outputting a plurality of input clock signals having different frequencies, comprising:

a first flip-flop group including at least one flip-flop for taking in an inverted signal of a select signal selecting a first input clock signal or a second input clock signal, said at least one flip-flop operating according to said first input clock signal;

a second flip-flop group including at least one flip-flop for taking in said select signal, said at least one flip-flop operating according to said second input clock signal;

a third flip-flop group including at least one flip-flop for taking in an output signal of said second flip-flop group, said at least one flip-flop operating according to said first input clock signal;

a fourth flip-flop group including at least one flip-flop for taking in an output signal of said first flip-flop group, said at least one flip-flop operating according to said second input clock signal; and an output circuit for disabling output of one signal that is not selected by said select signal, out of said first input clock signal and said second input clock signal, wherein, in a case where each flip-flop of said first to fourth flip-flop groups operates on rising edge of an input signal from a clock input terminal, said output circuit disables and resumes output of said first input clock signal based on an output signal of a first gate circuit depending on whether the first input clock signal is selected, and disables and resumes output of said second input clock signal based on an output signal of a second gate circuit depending on whether the second input clock signal is selected, said first gate circuit performing logical OR operation on an output signal of said first flip-flop group and an inverted signal of an output signal of said third flip-flop group, said second gate circuit performing logical OR operation on an output signal of said second flip-flop group and an inverted signal of an output signal of said fourth flip-flop group.

2. The clock switching circuit according to claim 1, wherein:

said first flip-flop group comprises a first flip-flop and a second flip-flop which both operate according to said first input clock signal, said first flip-flop taking in said inverted signal of said select signal, said second flip-flop taking in an output signal of the first flip-flop;

said second flip-flop group comprises a third flip-flop and a fourth flip-flop which both operate according to said second input clock signal, said third flip-flop taking in said select signal, said fourth flip-flop taking in an output signal of the third flip-flop;

said third flip-flop group comprises a fifth flip-flop and a sixth flip-flop which both operate according to said first input clock signal, said fifth flip-flop taking in an output signal of said fourth flip-flop, said sixth flip-flop taking in an output signal of the fifth flip-flop;

said fourth flip-flop group comprises a seventh flip-flop and an eighth flip-flop which both operate according to said second input clock signal, said seventh flip-flop taking in an output signal of said second flip-flop, said eighth flip-flop taking in an output signal of the seventh flip-flop.

3. The clock switching circuit according to claim 1, wherein said output circuit further comprises:
- a third gate circuit for performing logical OR operation on an output signal of said first gate circuit and said first input clock signal;
- a fourth gate circuit for performing logical OR operation on an output signal of said second gate circuit and said second input clock signal; and
- a fifth gate circuit for performing logical OR operation on output signals of said third gate circuit and said fourth gate circuit.

4. The clock switching circuit according to claim 1, wherein a plurality of circuits each composed of said first flip-flop group, said second flip-flop group and said output circuit is provided to select and output one input clock signal out of at least three input clock signals having different frequencies.

5. The clock switching circuit according to claim 1, wherein said output circuit determines an opening timing and a closing timing of an output disabling period of said first input clock signal, based on the output signals of said first flip-flop group and third flip-flop group, in case where said first input clock signal is not selected.

6. The clock switching circuit according to claim 1, wherein said output circuit determines an opening timing and a closing timing of an output disabling period of said second input clock signal, based on the output signals of said second flip-flop group and fourth flip-flop group, in case where said second input clock signal is not selected.

* * * * *